United States Patent [19]

Tai et al.

[11] Patent Number: 5,043,794
[45] Date of Patent: Aug. 27, 1991

[54] INTEGRATED CIRCUIT PACKAGE AND COMPACT ASSEMBLIES THEREOF

[75] Inventors: King L. Tai, Berkeley Heights; John Thomson, Jr., Spring Lake, both of N.J.

[73] Assignee: AT&T Bell Laboratories, Murray Hill, N.J.

[21] Appl. No.: 587,308

[22] Filed: Sep. 24, 1990

[51] Int. Cl.5 .................... H01L 23/12; H01L 23/14; H01L 23/32
[52] U.S. Cl. .................................. 357/74; 357/75; 357/81; 357/80
[58] Field of Search .................. 357/75, 74, 81, 72, 357/80

[56] References Cited

U.S. PATENT DOCUMENTS

| | | | |
|---|---|---|---|
| 4,631,572 | 12/1986 | Zimmerman | 357/74 |
| 4,638,348 | 1/1987 | Brown et al. | 357/74 |
| 4,654,694 | 3/1987 | Val | 357/74 |
| 4,879,588 | 11/1989 | Ohsuka et al. | 357/74 |
| 4,890,153 | 12/1989 | Wu | 357/74 |
| 4,894,706 | 1/1990 | Sato et al. | 357/75 |
| 4,953,005 | 8/1990 | Carlson | 357/75 |
| 4,956,694 | 9/1990 | Eide | 357/74 |

Primary Examiner—Rolf Hille
Assistant Examiner—S. V. Clark
Attorney, Agent, or Firm—Glenn E. Books

[57] ABSTRACT

In accordance with the present invention, an integrated circuit package comprises a thermally conductive plate for receiving an integrated circuit and an open rectangular structure of conductor and insulator for surrounding the sides of the circuit and presenting one or more linear arrays of conductive connectors extending laterally through the rectangular structure. Preferably the rectangular structure also includes transverse contacts. Advantageously the plate includes extensions beyond the rectangular structure for acting as cooling fins on opposing sides of the rectangular structure. The linear arrays and cooling fins are preferably on different pairs of parallel sides.

7 Claims, 5 Drawing Sheets

INTEGRATED CIRCUIT PACKAGE AND COMPACT ASSEMBLIES THEREOF

FIELD OF THE INVENTION

This invention relates to packaging for integrated circuits and, in particular, to an integrated circuit package particularly adapted for use in compact assemblies and clusters requiring a high degree of interconnection.

BACKGROUND OF THE INVENTION

As integrated circuits become increasingly complex and are used in assemblies to perform increasingly complex electronic functions, the necessity of providing interconnection paths among circuits and circuit assemblies becomes increasingly a limit on design. For example, in a number of applications the traditional dual-in-line integrated circuit package (DIP) simply cannot provide an adequate number of interconnections, and it has been necessary to go to a new form of integrated circuit packaging such as a package providing a two dimensional grid of interconnect pins. Such pin grid arrays (PGA) are not only bulky but also are delicate and expensive to make.

SUMMARY OF THE INVENTION

In accordance with the present invention, an integrated circuit package comprises a thermally conductive plate for receiving an integrated circuit and an open rectangular structure of conductor and insulator for surrounding the sides of the circuit and presenting one or more linear arrays of conductive connectors extending laterally through the rectangular structure. Preferably the rectangular structure also includes transverse contacts. Advantageously the plate includes extensions beyond the rectangular structure for acting as cooling fins on opposing sides of the rectangular structure.

The integrated circuit package of the invention permits the aggregation of packages into assemblies and into clusters of assemblies rich in interconnections. Vertically stacked packages form a rectangular parallelepiped having a plurality of parallel planar cooling fins projecting from two opposing surfaces and another pair of planar surfaces providing rectangular arrays of contacts to the enclosed integrated circuits. In addition, transverse contacts permit electrical interconnection of the stacked packages.

Linear clusters can be aggregated as a linear array of such assemblies with their contact surfaces interconnected either directly by an anisotropically conducting plane or indirectly by an intervening transformation plane. In a preferred linear cluster, successive assemblies are rotated by 90° with respect to the axis of the array. In such clusters each package in the rotated assembly contacts each package in the neighboring assemblies. In low power equipment, elimination of the cooling fins permits even higher levels of interconnection such as rectangular clusters of assemblies.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale. Similar structural elements are denoted by the same reference numeral throughout the drawings.

DETAILED DESCRIPTION

Figure 1:
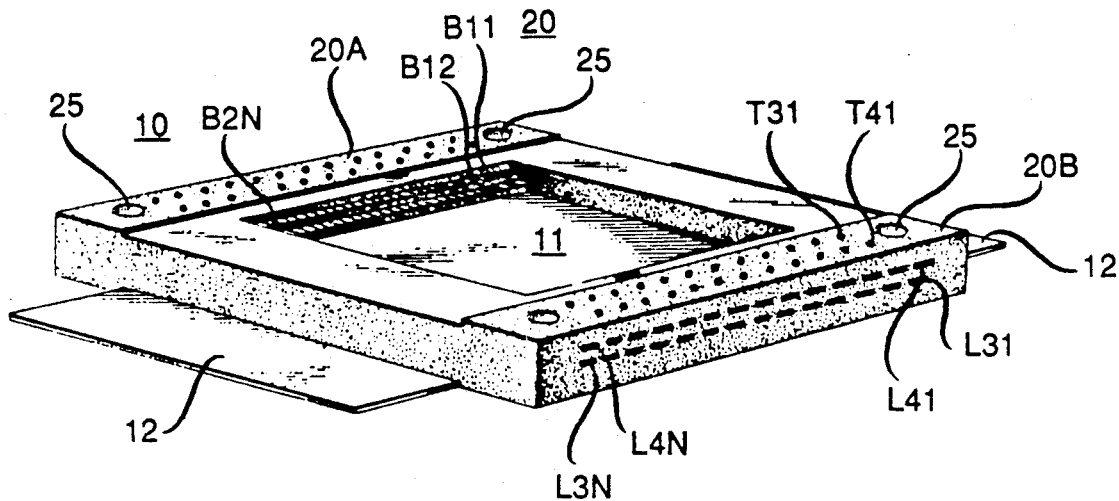
FIG. 1 is a schematic illustration of a preferred embodiment of an integrated circuit package in accordance with the invention.

Referring to the drawings, FIG. 1 shows a preferred embodiment of an integrated circuit package 10 in accordance with the invention comprising a thermally conductive plate 11 and an open rectangular structure 20, comprising layers of conductor and insulator and presenting one or more linear arrays of electrically conductive bonding pads. Preferably side 20A provides a lower linear array of bonding pads ($B_{11}, B_{12}, \ldots, B_{1n}$) and an upper linear array ($B_{21}, B_{22}, \ldots, B_{2n}$). Opposing side 20B provides lower array ($B_{31}, B_{32}, \ldots, B_{3n}$) (not shown) and upper array ($B_{41}, B_{42}, \ldots, B_{4n}$) (not shown). (As better shown in FIG. 3, the arrays of bonding pads are preferably presented on one or more stepped levels on the interior periphery of rectangular structure 20). Each of the bonding pads $B_{ij}$ is provided with lateral conductive connecting portion extending laterally from the bonding pad on the inside edge of the rectangular structure 20, through the structure to a respective lateral contact $L_{ij}$ on the transverse outside edge of 20. (The internal connections are illustrated in the cross section of FIG. 3.) Preferably each bonding pad $B_{ij}$ is also conductively connected through the rectangular structure 20 to a respective transverse contact $T_{ij}$ on a lateral edge of 20. The transverse contacts can extend completely through structure 20 to provide contact points $T_{ij}$ on both the upper lateral surface of 20 and the lower lateral surface (not shown in FIG. 1). Preferably plate 11 includes fin regions 12 extending beyond the external edges of rectangular structure 20 for acting as cooling fins. Conveniently the linear arrays $B_{ij}$ and the cooling fins 12 are on different pairs of opposing parallel sides of 20.

Advantageously rectangular structure 20 is provided with alignment means such as a plurality of openings 25, one in each corner, for use in aligning a plurality of such structures in an assembly.

Figure 2:
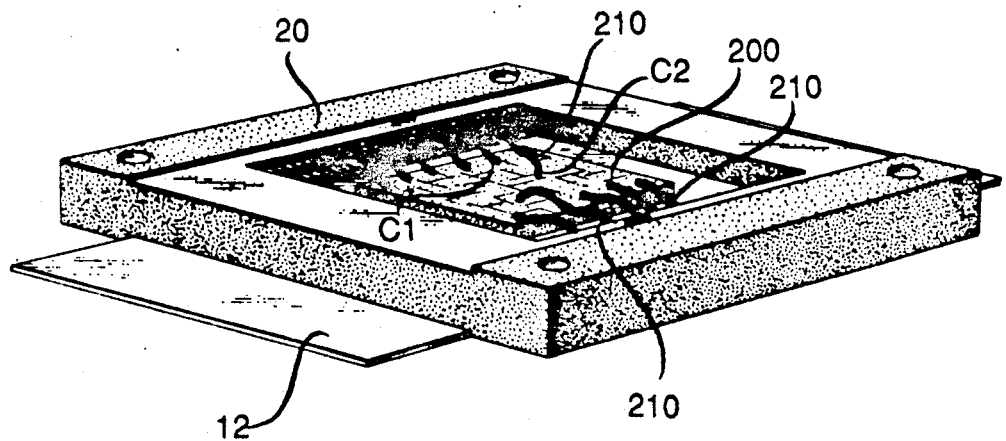
FIG. 2 shows the package of FIG. 1 with an integrated circuit in place.

As better shown in FIG. 2, the central opening in rectangular structure 20 is chosen so that the structure 20 can receive and laterally surround an integrated circuit 200 mounted on plate 11. The circuit 200 comprises a set of contacts $C_1, C_2, \ldots, C_n$ to which interconnection is desired, and these contacts $C_i$ are electrically connected to the set of bonding pads $B_{ij}$ preferably by gold wire bonds 210 in accordance with techniques well known in the art.

Figure 3:
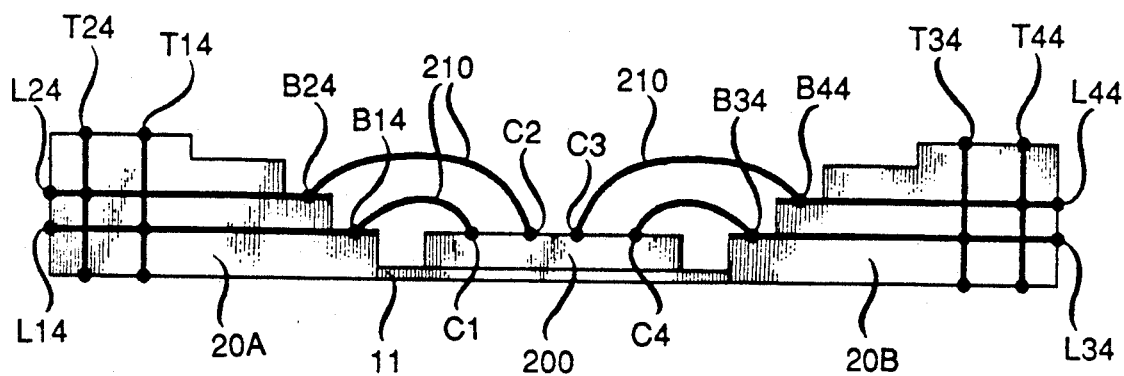
FIG. 3 is a schematic cross section of the structure of FIG. 2 useful in showing the interconnections which can be provided by the invention.

FIG. 3 is a schematic cross section of the structure of FIG. 2 useful in showing the interconnections provided by the invention. For example, contact $C_1$ on integrated circuit can be connected by wire 210 to bonding pad $B_{14}$ which, in turn, is connected to lateral contact point $L_{14}$ and transverse contact $T_{14}$. Similarly, $C_2$ is connected to bonding pad $B_{24}$ and thence to $L_{24}$ and $T_{24}$.

Figure 4:
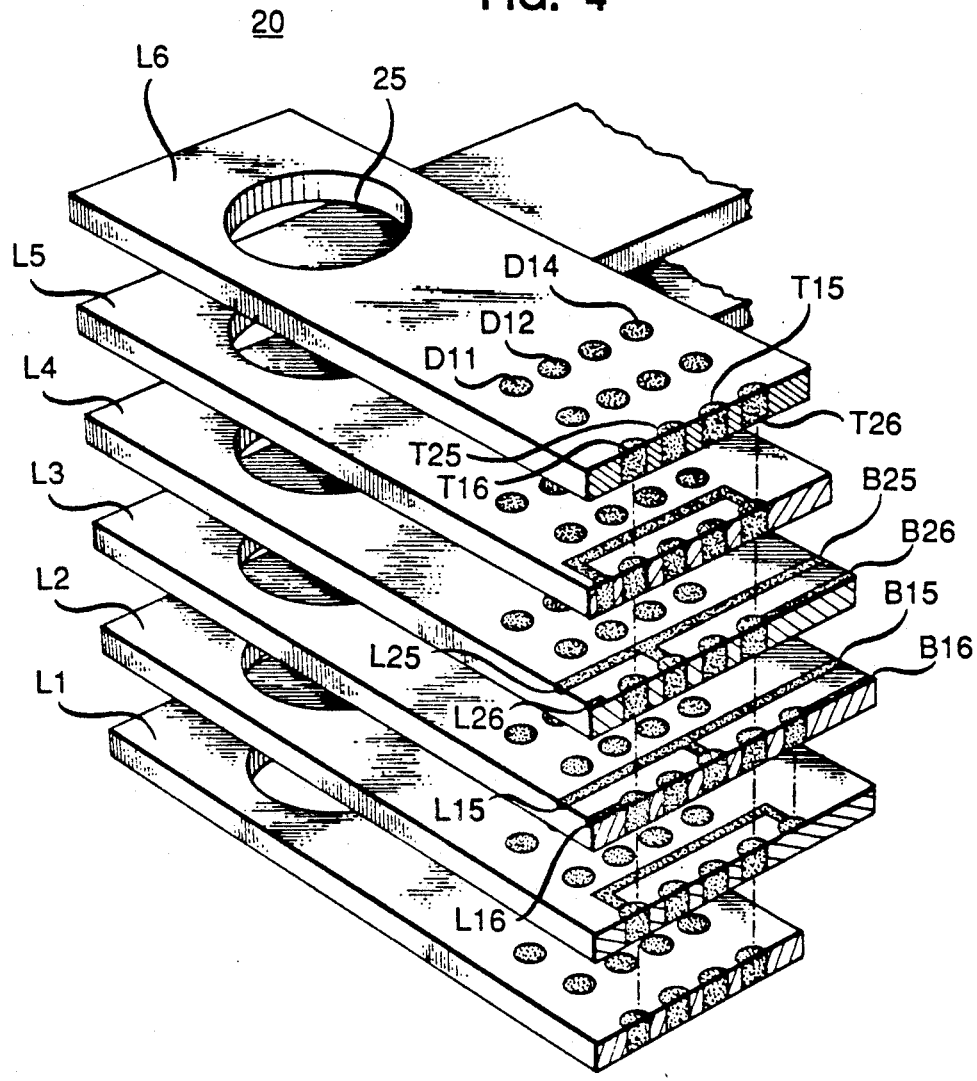
FIG. 4 is an enlarged, exploded view of components used in making an integrated circuit package in accordance with the invention.

The structure and fabrication of the package of FIGS. 1 and 2 can be better understood by reference to FIG. 4 which is an exploded view showing the principal components used in making a preferred rectangular structure 20.

In essence the structure 20 is built of a plurality of layers $L_1$ through $L_6$ of unsintered ceramic tape having an array of registered drilled apertures ($D_{11}, D_{12}, D_{13}, D_{14}, D_{21}, \ldots, D_{m4}$) in which transverse conductive connectors $T_{ij}$ can be formed. And upon the layers are printed conductive segments forming the lateral conductive connectors $L_{ij}$. As illustratively shown, the interior transverse surface of the rectangular structure (the surface facing into the central opening) presents two linear arrays of bonding pads $B_{ij}$ and one pair of bonding pads from each array is mapped into a single column of conductively filled apertures $D_{ij}$. Specifically, as shown, pads $B_{15}$ and $B_{16}$ of the lower array and pads $B_{25}$ and $B_{26}$ of the upper array are connected by conductively filled apertures to transverse contacts $T_{16}$, $T_{15}$, $T_{25}$ and $T_{26}$. Also as shown, the lateral connections can effect crossovers by going up a level or down a level as is done in connecting $B_{16}$ to $L_{16}$ and $B_{26}$ to $L_{26}$.

In the preferred embodiment, the ceramic layers $L_1$-$L_6$ are comprised of 0.04 inch thick green ceramic tape—a mixture of aluminum oxide ceramic powder and organic binder—such as Coors ceramic tape available from Coors Ceramic Corporation, Boulder, Colo. The apertures $D_{ij}$ can be $14\frac{1}{2}$ mils in diameter, and both the transverse and lateral connectors can be metallized with a screen printable ink containing tungsten metal particles such as Tungsten Ink marketed by Cernonics, Inc., Matawan, N.J. The conductive plate 11 can be a tungsten-copper alloy, such as Elkinite, having a coefficient of thermal expansion compatible with the ceramic. After the unsintered ceramic tape is imprinted with tungsten ink to form the desired conductive patterns, the layers $L_1$-$L_6$ are assembled in proper order and registration, pressed together at a pressure of 500 pounds per square inch and heated to a temperature of 70° C. for about 1 min to soften the binder and cause the individual layers to bond together. Final consolidation of the structure is effected by co-sintering the ceramic and the tungsten, as by sintering at 1625°±25° C. for 2 to 8 hours in a wet (dew point 70° C.) 80% $N_2$ by volume, 20% $H_2$ furnace atmosphere. The exposed metallized areas of the structure can then be electroplated with a pure nickel film about 0.0005 inch thick. Conductive plate 11 is then brazed to the lower lateral surface, and the metallized areas of the structure and the conductive plate can be electroplated with a gold film about 0.0002 inch thick. The result is an integral structure 20 with internal transverse and lateral connectors.

Thus an integrated circuit package in accordance with the invention comprises (1) a thermally conductive plate for supporting an integrated circuit and (2) an open rectangular structure having a central opening, exterior and interior transverse surfaces with respect to the central opening and parallel lateral surfaces. The rectangular structure is mounted on the conductive plate with the interior transverse surfaces positioned for extending around the periphery of the integrated circuit. At least one of the interior transverse surfaces of the rectangular structure presents at least one linear array of contact means (bonding pads) for interconnection with contacts on the integrated circuit. Each of the contact means is provided with an electrical connection laterally through the rectangular structure to the exterior transverse surface, and each of the contact means is provided with an electrical connection transversely through the rectangular structure to the overlying lateral surface. Preferably each one of a pair of opposing interior transverse surfaces of the open rectangular structure presents two linear arrays of contact means (bonding pads) for interconnection with contacts on the integrated circuit. In addition, the thermally conductive plate has portions extending beyond the exterior transverse surfaces of the other (remaining) pair of opposing surfaces for acting as cooling fins. Preferably the rectangular structure is provided with alignment means for aligning a bottom lateral surface of the package upon a top lateral surface of another such package. This alignment means can be a set of drilled openings in each of the four corner regions extending transversely through the rectangular structure.

Figure 5:
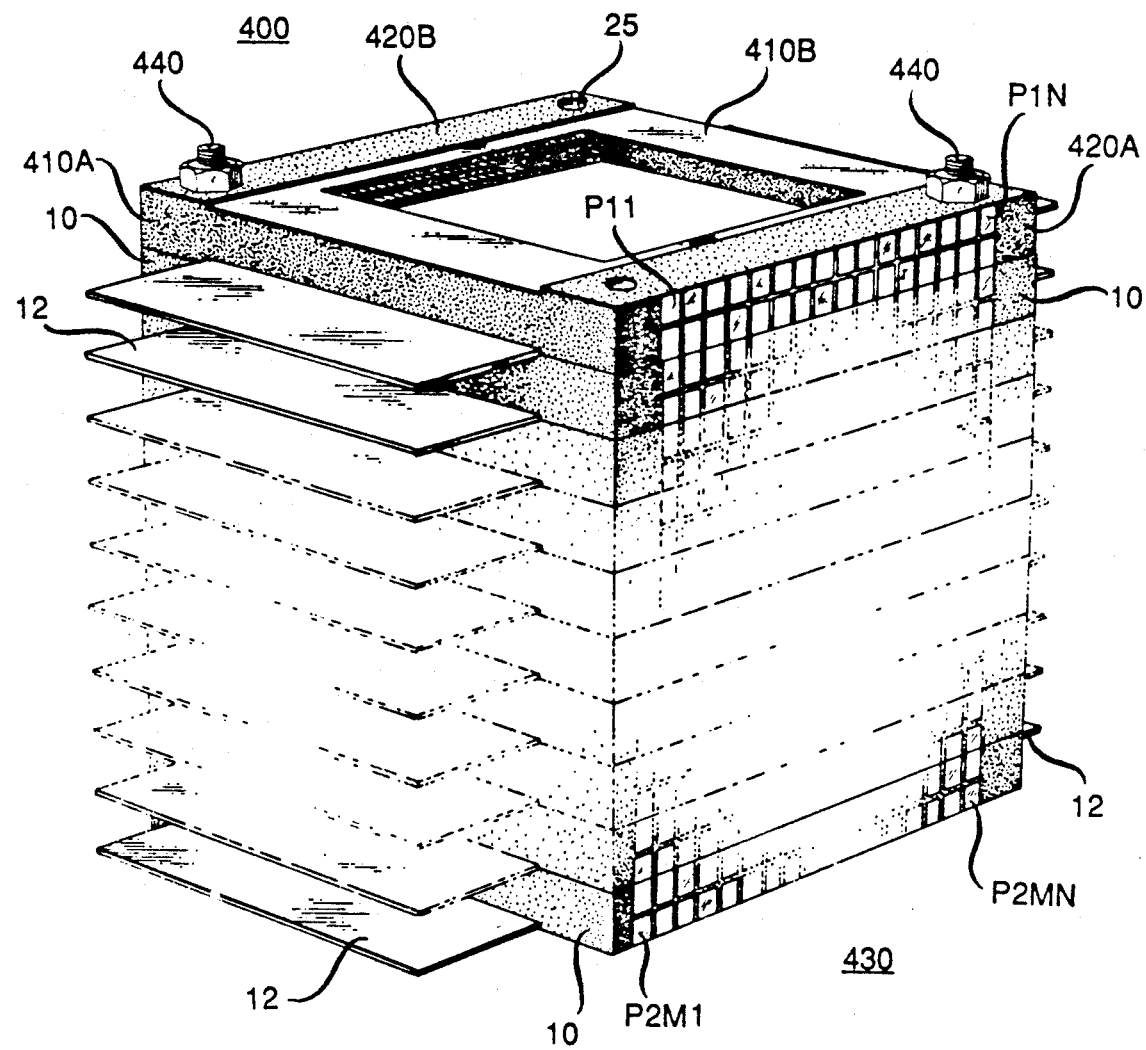
FIG. 5 is a schematic illustration of a stacked assembly of integrated circuits packaged in accordance with the invention.

Advantages of the invention will become clearer by reference to FIG. 5 which is a schematic illustration of a stacked assembly 400 of integrated circuit packages in accordance with the invention. Specifically, a plurality of m similarly oriented packages 10 are stacked one on top of the other to form a rectangular parallelpiped having a plurality of parallel planar cooling fins 12 projecting from a first pair of aligned transverse surfaces 410A and 410B and a second pair of aligned transverse surfaces 420A and 420B providing planar rectangular arrays 430 of lateral contact points to the enclosed integrated circuits. The surface area of each contact point ($L_{ij}$ of FIGS. 1-4) can be enhanced by depositing an array of gold pads onto the contact points. The result is a rectangular $2M \times N$ array of plated contacts ($P_{11}, \ldots, P_{2mn}$), with each contact of the 2M rows electrically contacting a bonding pad $B_{ij}$ and which, in turn, can be connected to a contact $C_i$ of an enclosed integrated circuit 200 (not shown). This planar array 430 defines a contact plane which can be used in interconnecting assemblies.

Interconnection between the transverse contacts $T_{ij}$ of the respective stacked packages can be facilitated by disposing between the packages thin sheets of anisotropic conductive material (not shown) such as the 25 mil EPCI material marketed by AT&T Microelectronics, Allentown, Pa. This material, comprising conductive particles in a silicone binding, selectively conducts in regions of compression between overlying contact points. Alternatively, if transverse interconnection is not desired, a thin insulating layer such as mylar can be interposed. Preferably the stacked assembly is bolted together by threaded vertical rods 440, through respective corresponding apertures 25 in each corner of each package 10.

Thus an assembly of integrated circuit packages in accordance with the invention comprises a plurality of integrated circuit packages, as described above, stacked one above the other with their respective exterior transverse surfaces aligned in a contact plane. Preferably the respective cooling fin portions are oriented in the same direction, the transverse openings in the corner regions are in alignment, and the plurality of packages is secured together in alignment by a rigid bolt through the aligned openings.

Figure 6:
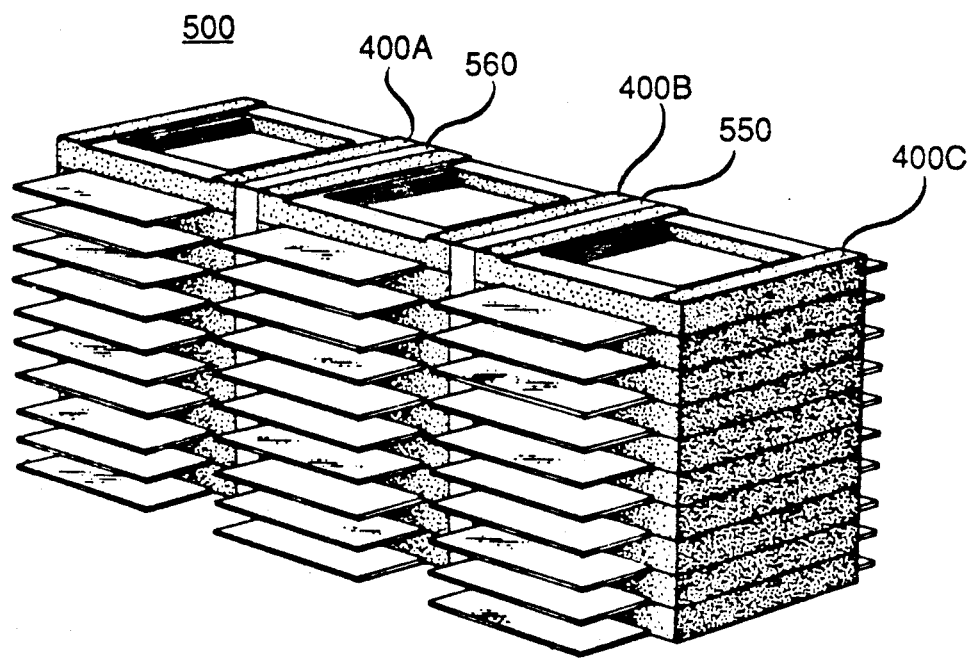
FIG. 6 is a schematic illustration of a linear cluster comprising a linear array of stacked assemblies of the type shown in FIG. 5.

As shown in FIG. 6, larger scale interconnections can comprise a linear cluster 500 of plural assemblies 400A, 400B and 400C. The stacked assemblies are preferably oriented with their respective contact surfaces (not shown) parallel and adjacent. Preferably the arrangement is designed so that desired interconnections between one assembly, e.g., 400A, and the adjacent assembly, e.g. 400B, are effected by contact between a contact plane 430 of 400A (not shown) and a contact plane 430 of 400B. Such contact can be facilitated by interposing a sheet 550 of EPCI material between the planar arrays. Thus the contacts of 400A, i.e. the set $P_{ij}$ would contact respective contacts $P'_{ij}$ of 400B. However if the assembly is not so designed, a transformation plane 560 can be disposed between 400A and 400B, to provide by suitable insulated interconnections, any desired mapping of contacts $P_{ij}$ into contacts $P'_{ij}$.

Figure 7:
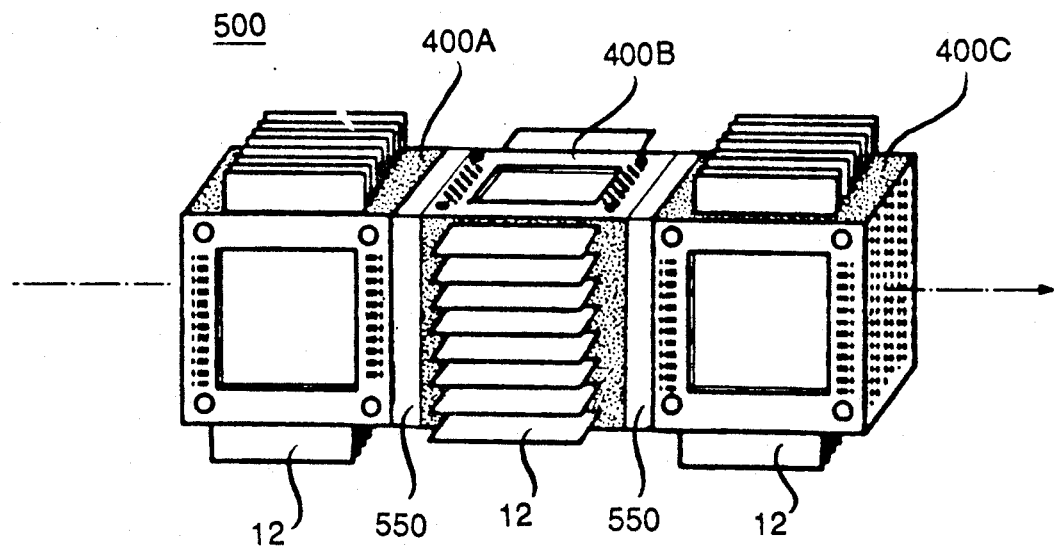
FIG. 7 illustrates a particularly advantageous embodiment of a linear cluster.

FIG. 7 shows a particularly advantageous embodiment of the invention comprising a linear cluster 500 of plural assemblies 400A, 400B, and 400C similar to the cluster shown in FIG. 6 except that the middle assembly 400B is rotated 90° about the axis of the array.

The contact planar arrays 430 of assembly 400B preferably each provide a square m×m matrix of contact points $P_{ij}$ where m is the number of packages in assembly 400B. Similarly, assemblies 400A and 400C each comprise m packages and preferably each provide a contact planar array comprising a m×m matrix of contact points. Thus when assembly 400B is rotated by 90° as shown, each package in assembly 400B is provided contact with each of the m packages in assembly 400C on the right and with each of the m packages in assembly 400A on the left. Thus each integrated circuit in assembly 400B can be provided contact with each integrated circuit in the entire cluster.

Clearly this linear cluster could be lengthened, as by adding an additional assembly 400D (not shown) rotated by 90° so that 400D is oriented similar to 400B. 400D would provide each of its packages contact with each of the m packages in neighboring assembly 400C.

Thus a linear cluster of assemblies of integrated circuit packages in accordance with the invention comprises a plurality of integrated circuit assemblies, as described above, disposed in a linear array with a contact plane of each respective assembly opposing and contacting a contact plane of at least one other assembly. Preferably the cluster comprises at least three integrated circuit assemblies each having square contact matrices, and the middle assembly of the linear array is rotated by 90° about the axis of the array so that each integrated circuit package of the middle assembly has at least one contact with every integrated circuit package of each neighboring assembly.

Figure 8:
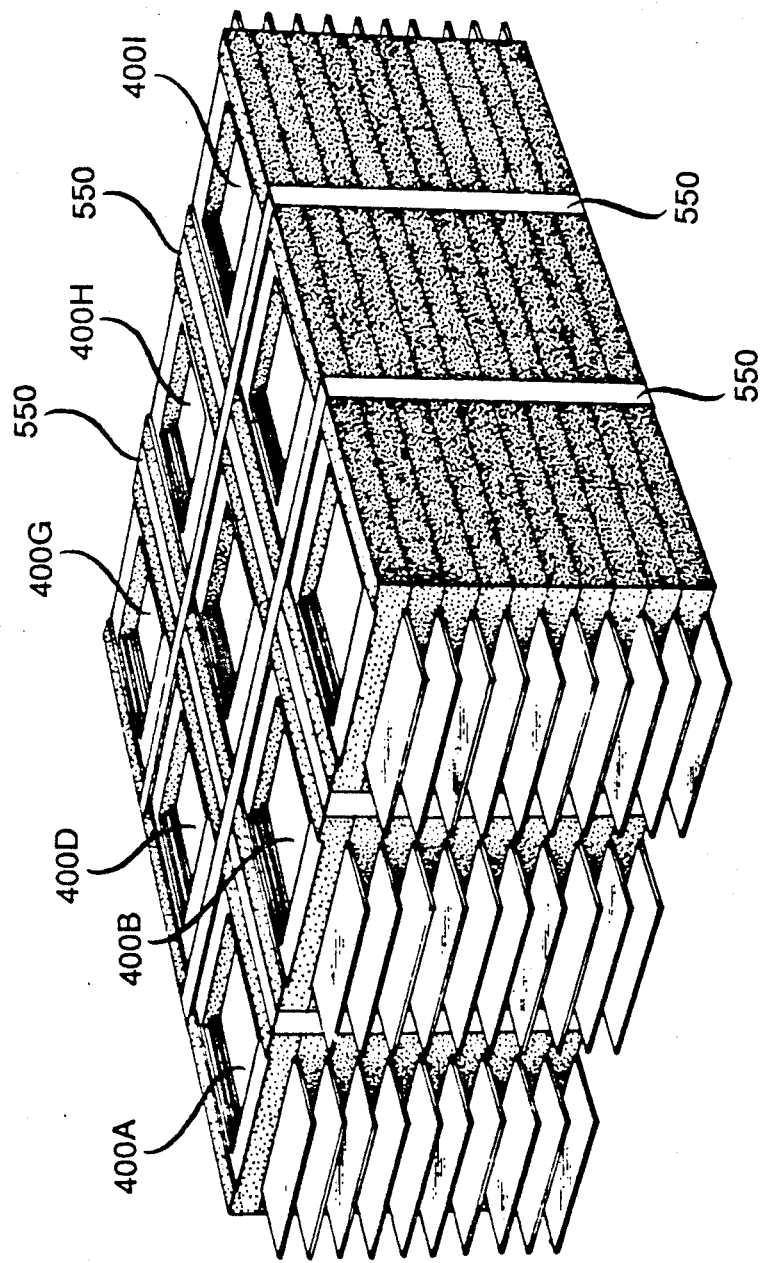
FIG. 8 illustrates a rectangular cluster of stacked assemblies.

In applications where cooling fins are not required for heat dissipation even larger scale clusters can be provided as shwon schematically in FIG. 8. Here each package 400A-400I has been modified by the elimination of fins on one or both sides and interconnections through the packages are provided on the sides where the fins have been removed. Stacked assemblies are then disposed in a rectangular array with each assembly electrically interconnected to one or more of its neighbors as described above. It is thus seen that the integrated circuit package of the invention provides a wide variety of highly compact assemblies and clusters rich in interconnections among the enclosed circuits.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

We claim:

1. An assembly of electrically interconnectable integrated circuit packages comprising:
    (a) a plurality of rectangular integrated circuit packages, each package comprising:
        (1) a thermally conductive plate for supporting an integrated circuit,
        (2) an open rectangular structure having a central opening, exterior transverse surfaces and interior peripheral surfaces with respect to said opening and parallel lateral surfaces, said rectangular structure mounted on said conductive plate with said interior peripheral surfaces positioned for extending around the periphery of an integrated circuit,
        (3) at least one interior peripheral surface presenting at least one linear array of contact means for interconnection with contacts on said integrated circuit, each of said contact means provided with electrical connection means extending laterally through said rectangular structure to a respective exterior transverse surface and each of said contact means provided with electrical connection means extending transversely through said rectangular structure to the overlying lateral surface,
    (b) alignment means for aligning said plurality of rectangular packages stacked with their exterior transverse surfaces aligned to form one or more contact planes; and
    (c) interconnect means disposed between successive stacked packages for interconnecting transverse contacts on the top lateral surface of each package with the bottom lateral surface of any next successive package whereby said stacked packages in said assembly are electrically interconnectable.

2. An assembly of integrated circuit packages according to claim 1 wherein a plurality of said packages have thermally conductive plates with portions extending beyond the exterior transverse surfaces of said packages for acting as cooling fins.

3. An assembly of integrated circuit packages according to claim 1 wherein said alignment means comprise aligned transverse openings in the corner regions of respective packages and bolt means through said openings for securing said packages together in alignment.

4. An assembly of integrated circuit packages according to claim 1 wherein said contacts laterally extending to exterior transverse surfaces are plated with conductive material to enhance electrical contact.

5. A linear cluster of integrated circuit assemblies comprising:
    a plurality of integrated circuit assemblies according to claim 1, said assemblies disposed in a linear array with a contact plane of each respective assembly opposing and contacting a contact plane of at least one other assembly.

6. A linear cluster of integrated circuit assemblies comprising:

three integrated circuit assemblies according to claim 1, said assemblies disposed in a linear array with a square contact array of each respective assembly opposing a square contact array of at least one other assembly, the middle assembly of said linear array being rotated by 90° about the axis of said array so that each integrated circuit package of said middle assembly has at least one contact with every integrated circuit package of each neighboring assembly.

7. A rectangular cluster of integrated circuit assemblies comprising:

a plurality of integrated circuit assemblies according to claim 1, said assemblies disposed in a rectangular array with a contact plane of each respective assembly opposing and contacting a contact plane of at least one other assembly.

* * * * *